(12) United States Patent
Lu et al.

(10) Patent No.: US 11,159,151 B1
(45) Date of Patent: Oct. 26, 2021

(54) CALIBRATING A PHASE INTERPOLATOR BY AMPLIFYING TIMING DIFFERENCES

(71) Applicant: Microsoft Technology Licensing, LLC, Redmond, WA (US)

(72) Inventors: Ping Lu, Raleigh, NC (US); Minhan Chen, Cary, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/082,273

(22) Filed: Oct. 28, 2020

(51) Int. Cl.
    *H03K 5/135* (2006.01)
    *H03F 3/217* (2006.01)
    *H04L 7/00* (2006.01)
    *H03K 5/00* (2006.01)

(52) U.S. Cl.
    CPC ........... *H03K 5/135* (2013.01); *H03F 3/2175* (2013.01); *H04L 7/0025* (2013.01); *H03K 2005/00286* (2013.01)

(58) Field of Classification Search
    None
    See application file for complete search history.

(56) References Cited

U.S. PATENT DOCUMENTS

| | | | | |
|---|---|---|---|---|
| 8,692,599 B2* | 4/2014 | Gong | ...................... | H03L 7/081 327/159 |
| 9,698,968 B2* | 7/2017 | Bonaccio | .............. | H04L 7/0029 |
| 10,511,312 B1 | 12/2019 | Pastorello et al. | | |
| 10,833,682 B1* | 11/2020 | Monk | ................... | H03L 7/0814 |
| 2020/0106597 A1 | 4/2020 | Hailu et al. | | |

OTHER PUBLICATIONS

Lu, et al., "A 2-D GRO Vernier Time-to-Digital Converter with Large Input Range and Small Latency", In Journal of Analog Integrated Circuits and Signal Processing, vol. 76, No. 2, Aug. 1, 2013, 13 Pages.
Lu, et al., "A 90nm CMOS Digital PLL Based on Vernier-Gated-Ring-Oscillator Time-to-Digital Converter", In IEEE International Symposium on Circuits and Systems (ISCAS), May 20, 2012, 2 Pages.

* cited by examiner

*Primary Examiner* — Cassandra F Cox
(74) *Attorney, Agent, or Firm* — Ranjeev Singh; Singh Law, PLLC

(57) ABSTRACT

Systems and methods related to calibrating a phase interpolator by amplifying timing differences are described. An example system includes a calibration stage configured to output a calibration code for a phase interpolator. The system further includes control logic configured to: (1) at least partially discharge a first pre-charged capacitive load in response to a signal output by the phase interpolator based on the calibration code, and (2) at least partially discharge a second pre-charged capacitive load in response to a reference signal associated with the phase interpolator. The system further includes a feedback path configured to provide feedback to the calibration stage to allow for a modification of the calibration code, where the feedback is dependent on a first voltage provided by the first pre-charged capacitive load and a second voltage provided by the second pre-charged capacitive load.

20 Claims, 11 Drawing Sheets

```
┌─────────────────────────────────────────────────────────────────────────────┐
│ AT LEAST PARTIALLY DISCHARGING A FIRST PRE-CHARGED CAPACITIVE LOAD AT LEAST IN RESPONSE TO │
│                    A SIGNAL OUTPUT BY A PHASE INTERPOLATOR                  │
└─────────────────────────────────────────────────────────────────────────────┘
                                        │
                                        │  ↘ 910
                                        ▼
┌─────────────────────────────────────────────────────────────────────────────┐
│ AT LEAST PARTIALLY DISCHARGING A SECOND PRE-CHARGED CAPACITIVE LOAD AT LEAST IN RESPONSE │
│              TO A REFERENCE SIGNAL ASSOCIATED WITH THE PHASE INTERPOLATOR                │
└─────────────────────────────────────────────────────────────────────────────┘
                                        │
                                        │  ↘ 920
                                        ▼
┌─────────────────────────────────────────────────────────────────────────────┐
│   PROVIDING FEEDBACK TO A CALIBRATION STAGE ASSOCIATED WITH THE PHASE INTERPOLATOR TO    │
│  MODIFY A SIGNAL OUTPUT BY THE PHASE INTERPOLATOR, WHERE THE FEEDBACK IS DEPENDENT ON A  │
│  FIRST VOLTAGE PROVIDED BY THE FIRST PRE-CHARGED CAPACITIVE LOAD AFTER AT LEAST PARTIAL  │
│ DISCHARGING OF THE FIRST PRE-CHARGED CAPACITIVE LOAD AND A SECOND VOLTAGE PROVIDED BY    │
│ THE SECOND PRE-CHARGED CAPACITIVE LOAD AFTER AT LEAST PARTIAL DISCHARGING OF THE SECOND  │
│                              PRE-CHARGED CAPACITIVE LOAD                                 │
└─────────────────────────────────────────────────────────────────────────────┘
                                                                          ↘ 930
                                       900

FIG. 9
```

CALIBRATING A PHASE INTERPOLATOR BY AMPLIFYING TIMING DIFFERENCES

BACKGROUND

In many applications, very fine clock phases are needed for phase alignment, data alignment, or fractional frequency division. While a phase-locked loop (PLL) can be used to generate different clock phases, finer clock phases are generated by interpolating two input reference clocks that have a relatively large but accurate phase difference between them. However, phase interpolators usually suffer nonlinearity due to device/layout mismatch or nonideal current sources. The nonlinearity causes uneven fine phases. This in turn significantly degrades the clock performance or the bit error rate (BER).

Accordingly, there is a need for improvements to phase interpolation circuits and methods.

SUMMARY

In one example, the present disclosure relates to a system including a calibration stage configured to output a calibration code for a phase interpolator. The system may further include control logic configured to: (1) at least partially discharge a first pre-charged capacitive load at least in response to a signal output by the phase interpolator based on the calibration code, and (2) at least partially discharge a second pre-charged capacitive load at least in response to a reference signal associated with the phase interpolator. The system may further include a feedback path configured to provide feedback to the calibration stage to allow for a modification of the calibration code, where the feedback is dependent on a first voltage provided by the first pre-charged capacitive load after at least partial discharging of the first pre-charged capacitive load and a second voltage provided by the second pre-charged capacitive load after at least partial discharging of the second pre-charged capacitive load.

In another example, the present disclosure relates to a method for calibrating a phase interpolator. The method may include at least partially discharging a first pre-charged capacitive load at least in response to a signal output by the phase interpolator. The method may further include at least partially discharging a second pre-charged capacitive load at least in response to a reference signal associated with the phase interpolator. The method may further include providing feedback to a calibration stage associated with the phase interpolator to modify a signal output by the phase interpolator, where the feedback is dependent on a first voltage provided by the first pre-charged capacitive load after at least partial discharging of the first pre-charged capacitive load and a second voltage provided by the second pre-charged capacitive load after at least partial discharging of the second pre-charged capacitive load.

In yet another example, the present disclosure relates to a system including a calibration stage configured to output a digital calibration code for a phase interpolator. The system may further include control logic configured to: (1) at least partially discharge a first pre-charged capacitive array at least in response to a signal output by the phase interpolator based on the digital calibration code, and (2) at least partially discharge a second pre-charged capacitive load at least in response to a reference signal associated with the phase interpolator, where the first pre-charged capacitive load is substantially equal to the second pre-charged capacitive load, where during calibration of one of interpolated phases output by the phase interpolator, the second pre-charged capacitive load is discharged only once and the first pre-charged capacitive load is discharged K number of times, where K is a positive integer greater than one. The system may further include a feedback path configured to provide feedback to the calibration stage to allow for a modification of the digital calibration code, where the feedback is dependent on a first voltage provided by the first pre-charged capacitive load after at least partial discharging of the first pre-charged capacitive load and a second voltage provided by the second pre-charged capacitive load after at least partial discharging of the second pre-charged capacitive load.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 9 shows a flow chart of a method in accordance with one example;

DETAILED DESCRIPTION

Examples described in this disclosure relate to systems and methods for calibrating a phase interpolator by amplifying timing differences. Fine time/phase intervals are required in many clock-generation related circuits. As an example, fine time/phase intervals may be required as part of time to digital converters (TDCs) and digital time to converters (DTCs). Fine phase intervals may be generated using phase interpolation. Phase interpolators may be used to generate precise clock phase as standalone circuits or as part of a phase-locked loop (PLL) or a delay-locked loop (DLL). Phase interpolators may also be used as part of clock and data recovery (CDR) circuits.

Figure 1:
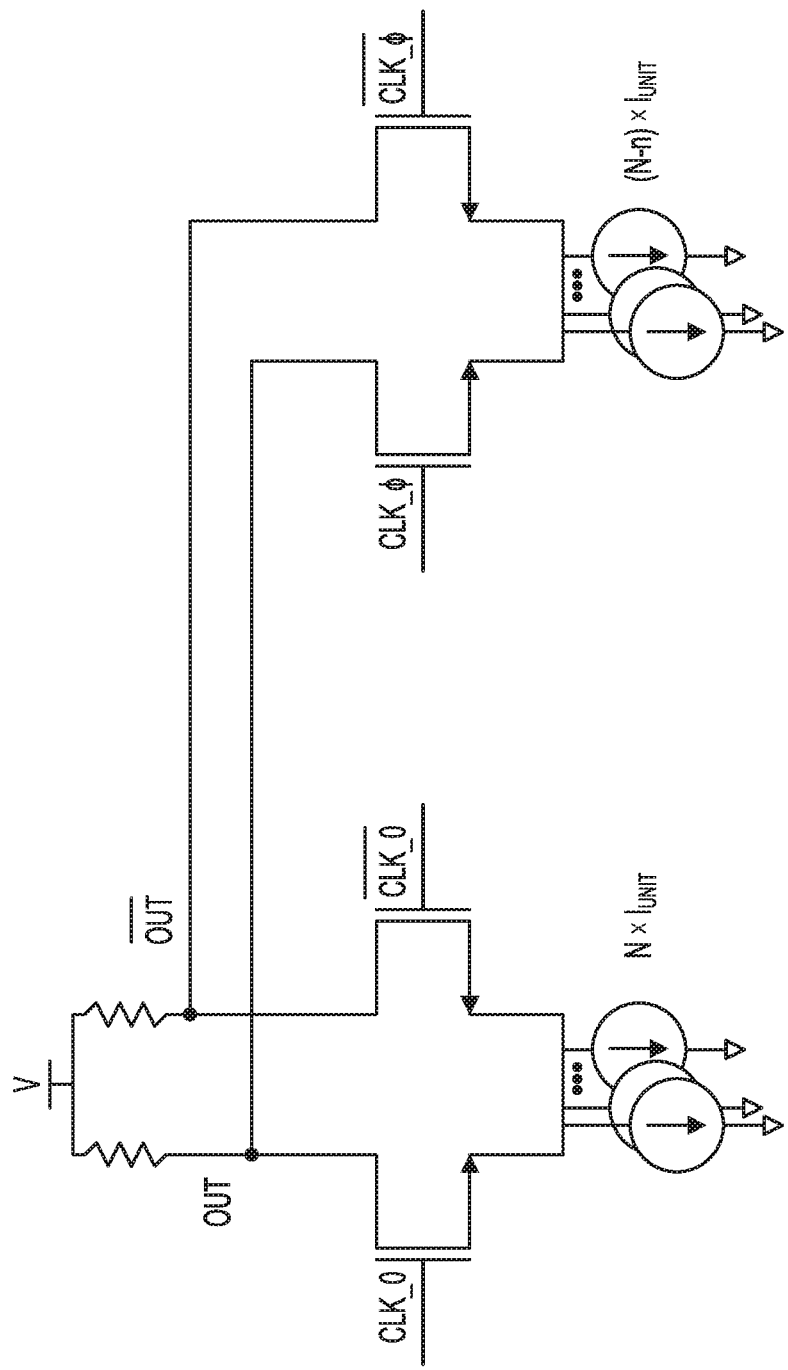
FIG. 1 is a circuit diagram of a phase interpolator in accordance with one example.

FIG. 1 is a circuit diagram of a phase interpolator 100 in accordance with one example. Phase interpolator 100 may have two input clock signals (e.g., clk_0 and clk_ϕ). A control input to the phase interpolator may specify the interpolated phase mixing requirement. The phase mixing requirement may be an interpolation factor, a number (e.g., n) that may vary from 0 to N such that when n=0, then one of the input clock signals (clk_ϕ) may be output by the phase interpolator; alternatively, when n=N, then the other input clock signal (clk_0) may be output by the phase interpolator. The output phase (θ) may generally be represented by the equation $$\tan^{-1}\frac{n*\sin(\varphi)}{(N-n)+n*\cos(\varphi)}+\Delta n.$$

Although FIG. 1 shows phase interpolator 100 as including a certain number of components arranged in a certain way, phase interpolator 100 may include fewer or additional components arranged differently.

Phase interpolators may suffer nonlinearity. As an example, phase interpolators may suffer from both integrated nonlinearity and differential nonlinearity. Nonlinearity may reflect a measure of the deviation between an expected ideal value and the measured output value for various phase select codes. Such nonlinearity may be caused due to device/layout mismatches that occur during the fabrication of the semiconductor chips. The effect of the nonlinearity may be poor performance in terms of noise, spurious tones, and phase accuracy.

Certain examples of the present disclosure improve the phase interpolation accuracy using time amplifier (TA)-based clock phase calibration circuits and methods. Time amplifying may include using a constant current to charge/discharge, a capacitive load stage including a first capacitor (C1) and a second capacitor (C2) where the ratio of the capacitances of the two capacitors (capacitance of capacitor C1/capacitance of capacitor C2) is k (a positive number). Assuming the first capacitor (C1) is charged for a time $t_n = t_{ref}/k$ and the second capacitor (C1) is charged for a time $t_{ref}$ (a time interval derived from a reference clock) then because the charge/discharge time is inversely proportional to the ratio of the capacitances, as shown in the equations in Table 1, the output voltages from the two capacitors should be equal.

TABLE 1

$$\frac{i}{C0} \times t_n = \Delta V_n - \rightarrow \frac{i}{kC0} \times (k \times t_n) = \Delta V_n$$

$$\frac{i}{kC0} \times (t_{ref}) = \Delta V_{ref}$$

$$\Delta V_n = \Delta V_{ref} (\text{if } k \times t_n = t_{ref})$$

By comparing the two voltages, one can determine whether the time interval $t_n$ is equal to the nominal time interval $t_{ref} = t_n/k$.

Alternatively, in another example, two capacitors having almost exactly the same fixed capacitance are used. A digital logic control may be used to allow the time interval ($t_n$) to charge/discharge one of the capacitors (C1) k number of times while the reference time interval ($t_{ref}$) may be used to charge/discharge the capacitor (C2) only once. The difference in the number of times a capacitor is charged/discharged is equivalent to the time amplifying implemented by the proportional capacitors as shown via the equations in Table 2.

TABLE 2

$$\frac{i}{kC0} \times t_n = \Delta V_n - \rightarrow \frac{i}{kC0} \times (t_n) \times k = \Delta V_n$$

$$\frac{i}{kC0} \times (t_{ref}) = \Delta V_{ref}$$

$$\Delta V_n = \Delta V_{ref} (\text{if } t_n \times k = t_{ref})$$

This implementation may, however, be able to achieve higher phase accuracy than the implementation having proportional capacitors. This is because this arrangement may effectively eliminate the charge sharing error present in the other example.

Figure 2:
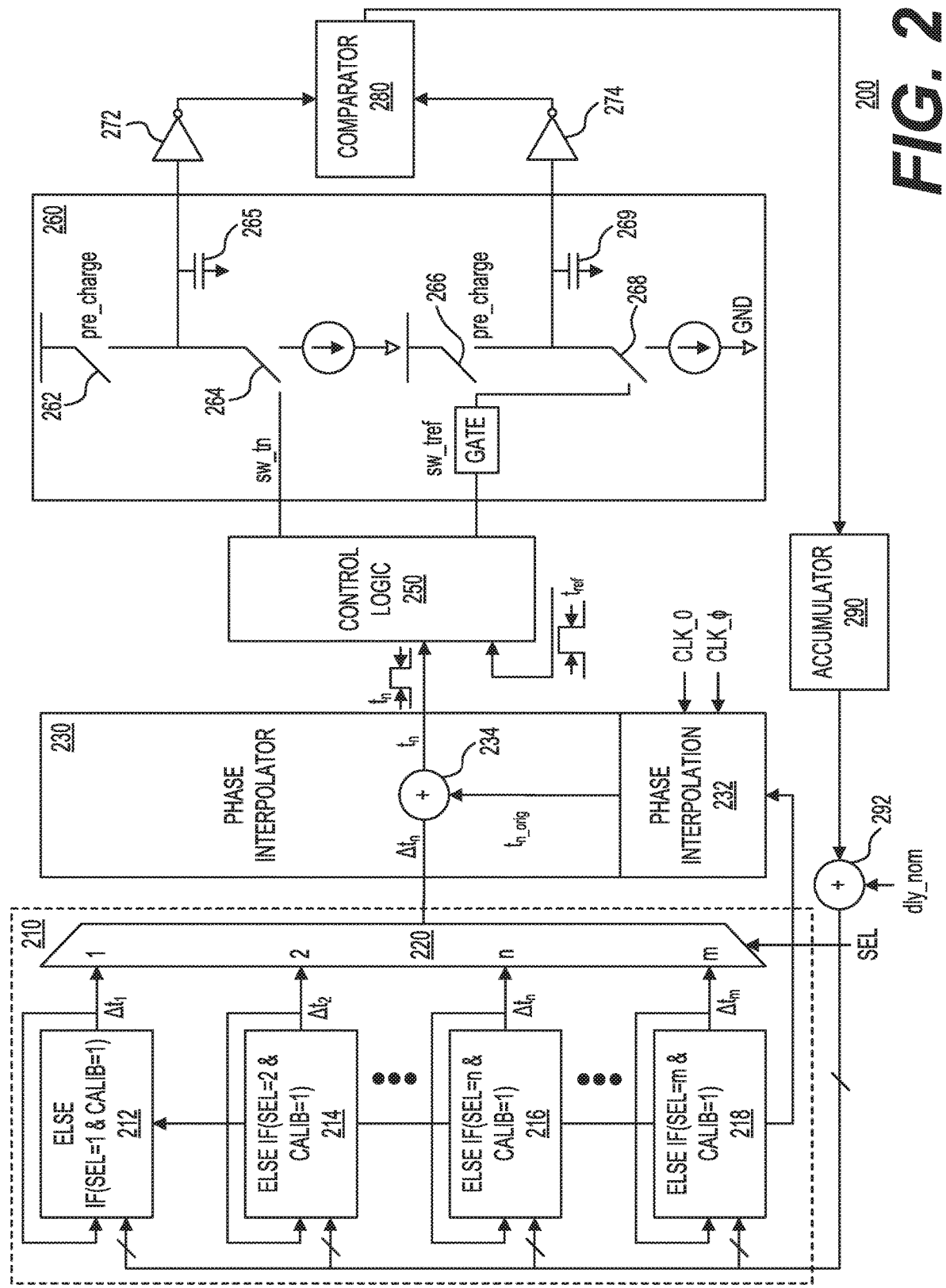
FIG. 2 is a block diagram of a system including a phase interpolator with clock phase calibration in accordance with one example.

FIG. 2 is a block diagram of a system 200 including a phase interpolator with clock phase calibration in accordance with one example. System 200 may correspond to an implementation that uses the difference in the number of times load capacitors are charged/discharged. System 200 may include a calibration stage 210, a phase interpolator 230, a control logic 250, a capacitive load stage 260, a comparator 280, and an accumulator 290. System 200 may operate in a calibration mode or a normal mode. In the calibration mode, system 200 may be operated to allow or time amplifier-based phase calibration. Calibration stage 210 may include circuitry to provide a controlled amount of delay in time based on feedback provided to calibration stage 210. In this example, calibration stage 210 may include logic blocks (e.g., logic blocks 212, 214, 216, and 218) that may respond to two control signals: a select (SEL) signal and a calibration (CALIB) signal. When system 200 is set to operate in the calibration mode, the CALIB signal may be set to a logic high value (e.g., logic 1). Alternatively, when system 200 is set to operate in the normal mode, the CALIB signal may be set to a logic low value (e.g., logic 0). The value of the SEL signal may determine which delay amount ($\Delta t_1$, $\Delta t_2$, $\Delta t_n$, or $\Delta t_m$) is applicable. In this example, if the value of the SEL signal is 1 then the delay amount of $\Delta t_1$ may be applicable, if the value of the SEL signal is 2 then the delay amount of $\Delta t_2$ may be applicable, if the value of the SEL signal is n then the delay amount of $\Delta t_n$ may be applicable, or if the value of the SEL signal is m then the delay amount of $\Delta t_m$ may be applicable. Calibration stage 210 may further include a multiplexer 220 coupled to logic blocks 212, 214, 216, and 218. The output delay amounts may be supplied to multiplexer 220 that may be controlled using the SEL signal, as well. Thus, based on the value of the SEL signal, multiplexer 220 may output the appropriate delay (e.g., in the form of a digital code reflective of the delay) to phase interpolator 230. The SEL signal may equal to a value n', wherein n'=n or mod (m, n) depending on whether mod (m, n) is equal to zero or not.

In one example, calibration stage 210 may be used to calibrate for each of the phases for the interpolator. Thus, if the phase interpolator has an M number of interpolated phases (M being a positive integer) within a reference time interval then calibration stage 210 may be used to generate digital codes (or analog values) corresponding to each of the M phases. The digital code values may be latched in respective latches, a lookup table, or in one or more registers.

With continued reference to FIG. 2, phase interpolator 230 may be implemented in a similar manner as described with respect to FIG. 1. The time interval corresponding to the pre-calibration interpolated phase signal ($t_{n\_orig}$) may be adjusted based on the delay output from calibration stage 210. As an example, FIG. 2 shows a summer 234, which may be used to adjust the pre-calibration interpolated phase signal ($t_{n\_orig}$). The output of phase interpolator 230 may be coupled to control logic 250. Control logic 250 may be configured to control a capacitive load stage 260. Control logic 250 may be configured to provide two control signals: sw_tn and sw_tref. Each of these signals may be used to control discharging of the capacitive arrays in capacitive load stage 260. Additional details of control logic 250 are provided with respect to FIGS. 4, 5, and 6.

Still referring to FIG. 2, capacitive load stage 260 may be configured to receive the control signals from control logic 250 and provide output voltages that may be compared directly or indirectly (e.g., by using a time comparator 280). In this example, capacitive load stage 260 may include two capacitor arrays (e.g., capacitor array 265 and capacitor array 269). Each of capacitor array 265 and capacitor array 269 may be implemented using transistors or other semiconductor devices. As an example, a collection of such devices may be selectively enabled or disabled to provide appropriate capacitance values. In this example, capacitor array 265 and capacitor array 269 provide the same fixed load in terms of the capacitance values. Capacitive load stage 260 may further include switches 262, 264, 266 and 268 that may control the flow of current to (or from) a respective capacitor. Switch 262 may be used to pre-charge capacitor array 265 based on the status of the pre_charge signal. Switch 266 may be used to pre-charge capacitor array 269 based on the status of the other pre_charge signal shown in FIG. 2. Switch 264 (controlled by signal sw_tn) may be used to discharge capacitor array 265. Switch 268 (controlled by the gated signal sw_tref) may be used to discharge capacitor array 269.

Figure 3:
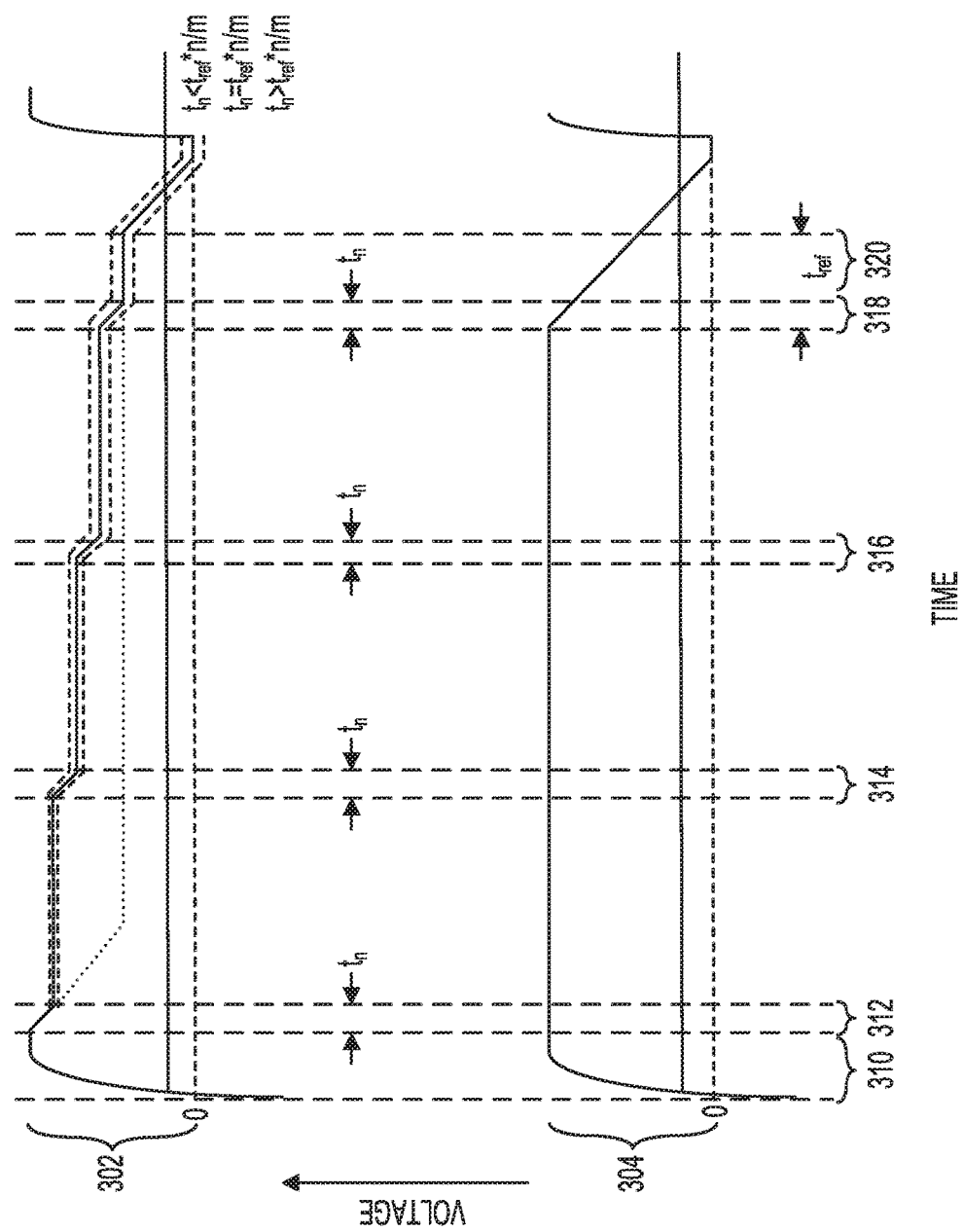
FIG. 3 shows voltage waveforms associated with the capacitive load stage of the system of FIG. 2 in accordance with one example.

FIG. 3 shows voltage waveforms 300 associated with capacitive load stage 260 of system of FIG. 2 in accordance with one example. Waveforms 300 reflect the shape and the magnitude of the voltages associated with capacitive array 265 and capacitive array 269 by mapping the magnitude of the voltage in a vertical direction and the time in a horizontal direction. Waveforms 302 correspond to the charging and the discharging of capacitor array 265 and waveform 304 corresponds to the charging and discharging of capacitor array 269. Time span 310 corresponds to the magnitude of the voltages during pre-charging of the two capacitive arrays. Timespan 312 corresponds to the first discharging of capacitive array 265 for a time interval of $t_n$. Timespan 314 corresponds to the second discharging of capacitive array 265 for a time interval of $t_n$. Timespan 316 corresponds to the third discharging of capacitive array 265 for a time interval of $t_n$. Timespan 318 corresponds to the fourth discharging of capacitive array 265 for a time interval of $t_n$. In this example, capacitive array 269 is discharged only once for a time interval of $t_{ref}$. In this example, using the block labeled GATE in FIG. 2, capacitive array 269 is discharged only once. This saves power as capacitive array 269 need not be discharged again and again and can be discharged only once.

Referring back to FIG. 2, comparator 280 may be used to produce a digital value indicative of a difference between the two output signals received from capacitive load stage 260. Comparator 280 may compare the two output signals (e.g., the voltage level $V_n$ corresponding to the output signal received from capacitive array 265 and the voltage level $V_{ref}$ corresponding to the output signal received from capacitive array 269) by converting the voltage difference into time difference. In this example, if the two voltage levels (e.g., $V_n$ and $V_{ref}$) are exactly the same, then after the discharging of the capacitive arrays, the rising time of the pulses output from inverters 272 and 274 will be substantially the same. On the other hand, if the two voltages are slightly different in terms of their magnitude, then the rising edges of the pulses will have a small time difference, which will be detected by comparator 280. Thus, instead of comparing voltage levels directly, the time difference between rising edges (or falling edges) may be compared. The use of the time comparator may help avoid the input DC dependence of the voltage comparator. Comparator 280 may generate a +1 if the output voltage from one of them is larger than the other one, a −1 if the output voltage from one of them is smaller than the other one, or a 0 if the output voltage from one of them is the same as the other one. In another example, comparator 280 may compare the voltage levels of the two output signals by using a voltage comparator. In this alternative example, system 200 may not include inverters 272 and 274. The output signals (e.g., the voltage level $V_n$ corresponding to the output signal received from capacitive array 265 and the voltage level $V_{ref}$ corresponding to the output signal received from capacitive array 269) may be compared to each other using a voltage comparator.

A feedback path including accumulator 290 may be used to provide feedback to calibration stage 210. Accumulator 290 may be used to integrate the output values provided by comparator 280 and scale the integrated value up or down using a constant. The output from accumulator 290 may be summed (e.g., using summer 292) with a nominal value for the delay (e.g., dly_nom in FIG. 2). Although FIG. 2 shows system 200 as including a certain number of components arranged and coupled in a certain way, system 200 may include fewer or additional components arranged and coupled differently. As an example, instead of discharging capacitive array 269 only once using the GATE in FIG. 2, capacitive array 269 may be pre-charged multiple times and be discharged multiple times such that the net result is the same as described above. As another example, instead of a digital version of the accumulator, an analog version of the accumulator may also be used. The analog output value may be converted into a digital value using a digital to analog converter (DAC).

Figure 4:
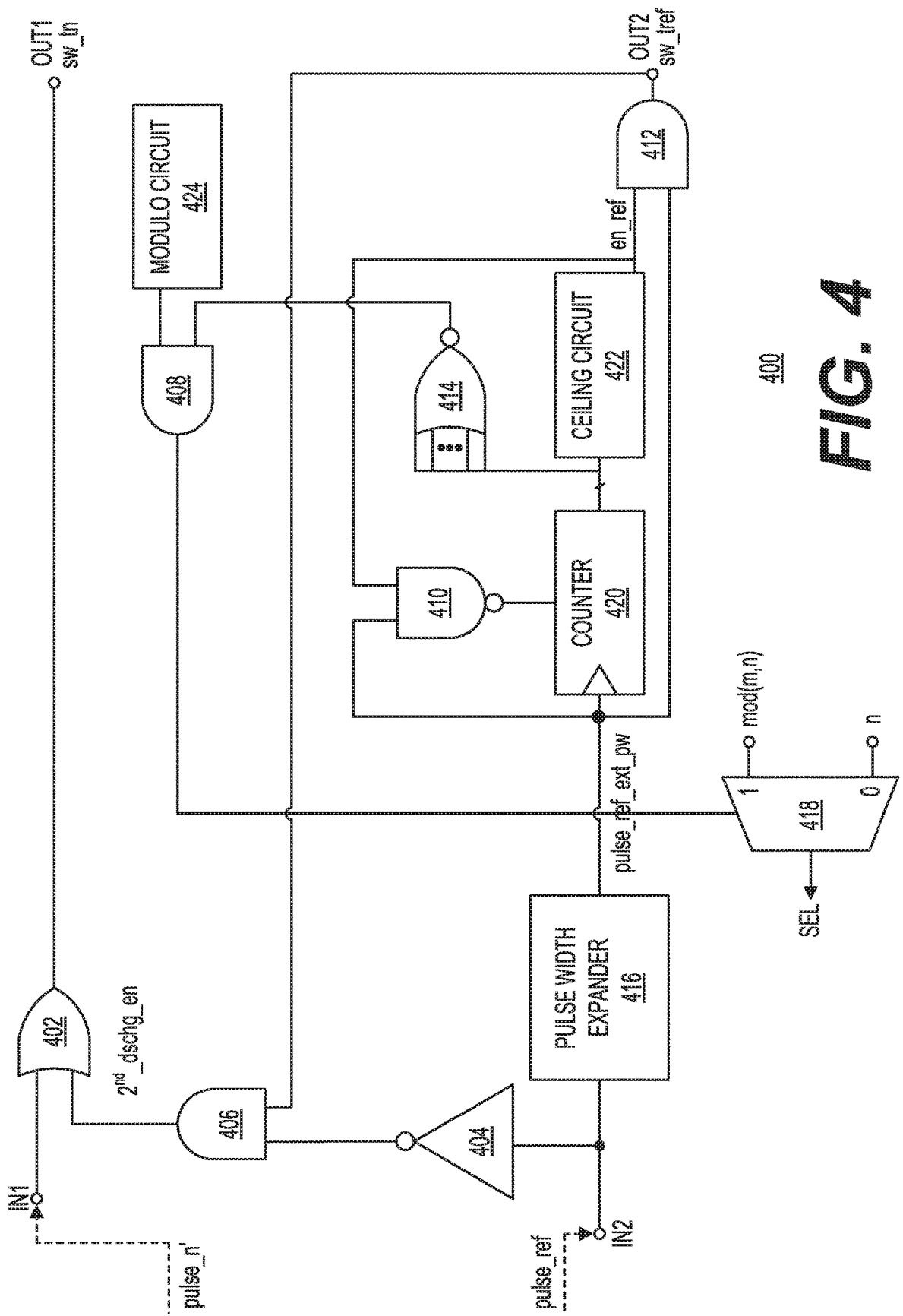
FIG. 4 is a circuit diagram of the control logic associated with the system of FIG. 2 in accordance with one example.

FIG. 4 is a circuit diagram of control logic 400 (e.g., control logic 250 associated with system 200 of FIG. 2) in accordance with one example. Control logic 400 may receive two inputs (e.g., via input terminals IN1 and IN2): one of the inputs may correspond to pulses output by the phase interpolator (referred to as pulse_n' signal in FIG. 4) and the other inputs may correspond to pulses based on the reference clock signal (referred to as pulse_ref in FIG. 4). Control logic 400 may include several logic gates, a counter, and other logic blocks to process the input signals and generate output signals (e.g., via output terminals OUT1 and OUT2: sw_tn and sw_ref, which may be used to control the discharging of the capacitor arrays in capacitive load stage 260 of FIG. 2 (described earlier). In this example, control logic 400 may include several logic gates, including an OR gate 402, an inverter 404, AND gates 406, 408, and 412, a NAND gate 410, and an NOR gate 414. These logic gates may be coupled to each other as shown in FIG. 4.

With continued reference to FIG. 4, control logic 400 may further include a pulse width expander 416, which may be configured to receive the pulse_ref input signal, via the IN1 input terminal, and provide an expanded pulse (referred to as pulse_ref_ext_pw) in FIG. 4. In this example, control logic 400 is implemented to address two different cases: (1) a case where n (n is the number of phases being interpolated) is a factor of m (the total number of phases being interpolated) (i.e., mod (m, n) equals 0); and (2) a case where n is not a factor of m (i.e., mod (m, n) is not equal to 0). To enable this aspect, control logic 400 may include a multiplexer 418 and a modulo circuit 424. Modulo circuit 424 may be configured to perform a mod (m, n) operation. Multiplexer 418 may output the value n, or the value mod (m, n) based on an output of AND gate 408. Control logic 400 may further include a counter 420, which may count the number of the expanded pulses. Counter 420 may further include input from NAND gate 410. The output of counter 420 may be coupled to the input of a NOR gate 414 and to ceiling circuit 422. Ceiling circuit 422 may perform a ceiling function (ceil(m/n)−1? 1'b1: 1'b0), which may clamp the counter output between "0" and a value of (ceil(m/n)−1). The output of ceiling circuit 422 may be used to reset counter 420 via NAND gate 410. In this way, counter 420 may have a period of ceil(m/n) clock cycles, which corresponds to the K number of discharge cycles. Thus, NAND gate 410 may help reset the counter output to zero once the counter output reaches ceil(m/n)−1 and thus work with ceiling circuit 422 to calculate different values of K for different values of n, where n is the number of phase being interpolated.

The output of ceiling circuit 422 may be coupled to one of the inputs of AND gate 412. AND gate 412 may further receive the expanded pulse signal (pulse_ref_ext_pw) and generate one of the control signals sw_tref. The pulse_ref input signal may be inverted using inverter 404 and coupled to one input of AND gate 406. AND gate 406 may further receive the sw_tref as its other input to generate an enable signal ($2^{nd}$_dschg_en), which may be coupled to one input of OR gate 402. OR gate 401 may receive the pulse_n' input signal via its second input terminal and provide sw_tn as the output control signal. Although FIG. 4 shows control logic 400 as including a certain number of components arranged in a certain manner, control logic 400 may include additional or fewer components arranged differently.

Figure 5:
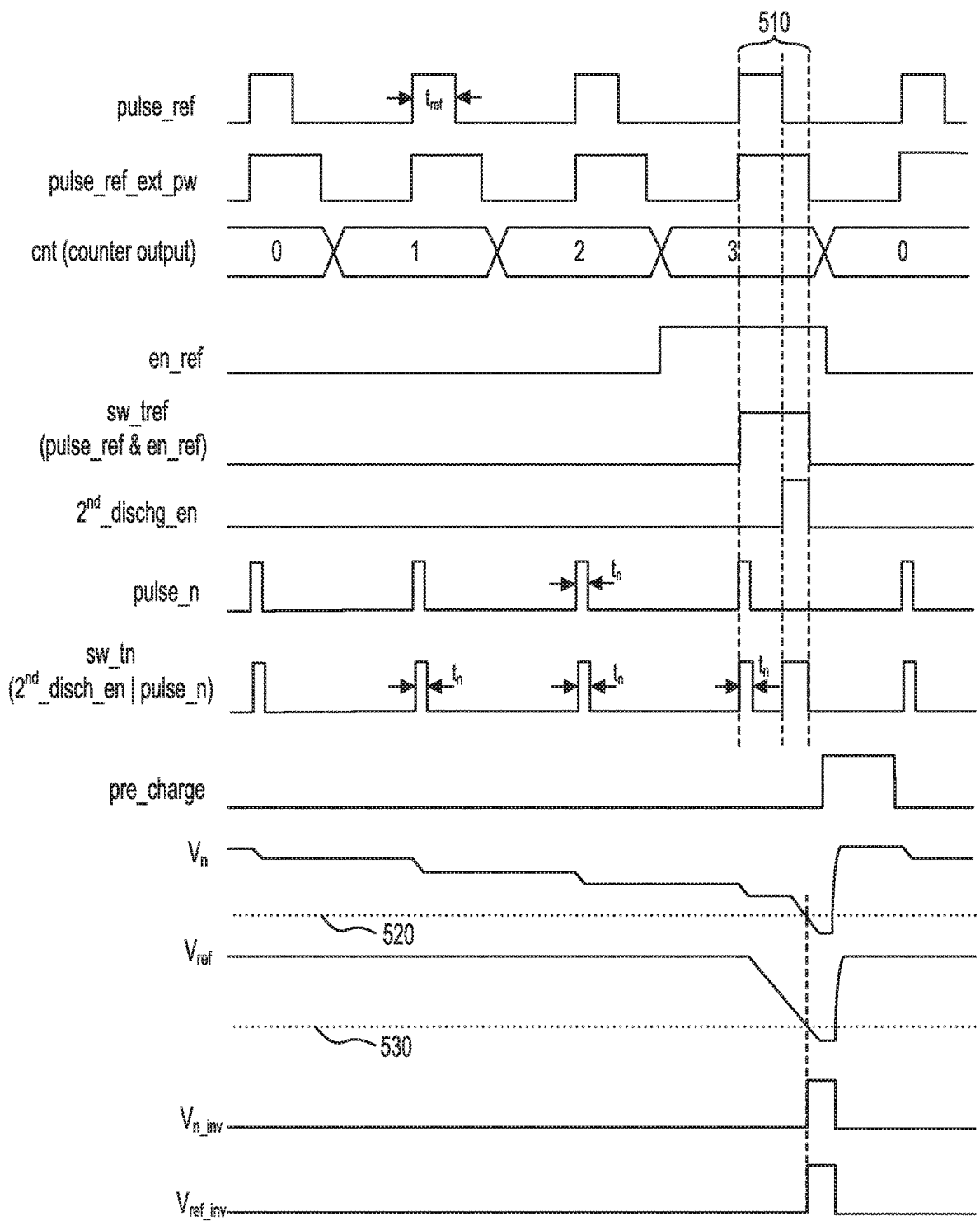
FIG. 5 is a timing diagram showing the signals associated with the system of FIG. 2 in accordance with one example.

FIG. 5 is a timing diagram 500 showing signals associated with system 200 of FIG. 2 in accordance with one example. As explained earlier with respect to FIG. 4, control logic 400 may be implemented to address two different cases: (1) a case where n (n is the number of phase being interpolated) is a factor of m (the total number of phases being interpolated) (i.e., mod (m,n) equals 0) and (2) a case where n is not a factor of m (i.e., mod (m,n) is not equal to 0). This example corresponds to a case in which mod (m, n) equals 0. In particular, the example signals in timing diagram 500 relate to a case in which n=1, 2, 4, or 8 and m=8. FIG. 5 corresponds to a case in which the number of the phase being interpolated (n) equals 2. Unless otherwise indicated, the signals shown in timing diagram are the same or similar to the signals described earlier with respect to FIG. 2 and FIG. 4. The pulse_n signal may correspond to the pulse_n' signal received via the input terminal (IN1) of control logic 400 of FIG. 4 and the pulse_ref signal may correspond to the pulse_ref signal received via the input terminal (IN2) of control logic 400 of FIG. 4. The pulse_ref_ext_pw signal, the cnt (counter output) signal, the en_ref, and the $2^{nd}$_dischg_en signal may correspond to the internal signals associated with control logic 400 of FIG. 4. The sw_tn signal may correspond to the output signal provided via the output terminal (OUT1) of control logic 400. The sw_tref signal may correspond to the output signal provided via the output terminal (OUT2) of control logic 400. In addition, as explained earlier, the sw_tn signal and the sw_tref signal may be used to control discharging of capacitive arrays described in FIG. 2. Timespan 510 including vertical dotted lines in FIG. 5 relate to the last discharging of capacitive array 265 of FIG. 2 and the only once discharging of capacitive array 269. As indicated by the pre_charge signal in FIG. 5, after this discharging phase, the capacitive arrays are charged again pursuant to the assertion of the pre_charge signal as shown in FIG. 2. Dotted line 520 in FIG. 5 corresponds to the threshold voltage of inverter 272 of FIG. 2 and dotted line 530 in FIG. 5 corresponds to the threshold voltage of inverter 274 of FIG. 2. In this example, if the two voltage levels (e.g., $V_n$ and $V_{ref}$) are exactly the same, then after the discharging of the capacitive arrays, the rising time of the pulse output from inverter 272 of FIG. 2 (shown as signal $V_{n\_inv}$ in FIG. 5) and the rising time of the pulse output from inverter 274 (shown as signal $V_{ref\_inv}$) will be substantially the same. On the other hand, if the two voltages are slightly different in terms of their magnitude, then the rising edges of the pulses will have a small time difference, which will be detected by comparator 280. Although FIG. 5 shows certain signals in timing diagram 500 having a certain relationship to each other, system 200 and control logic 400 may be designed differently, such that the signals shown in timing diagram 500 may have a different relationship to each other.

Figure 6:
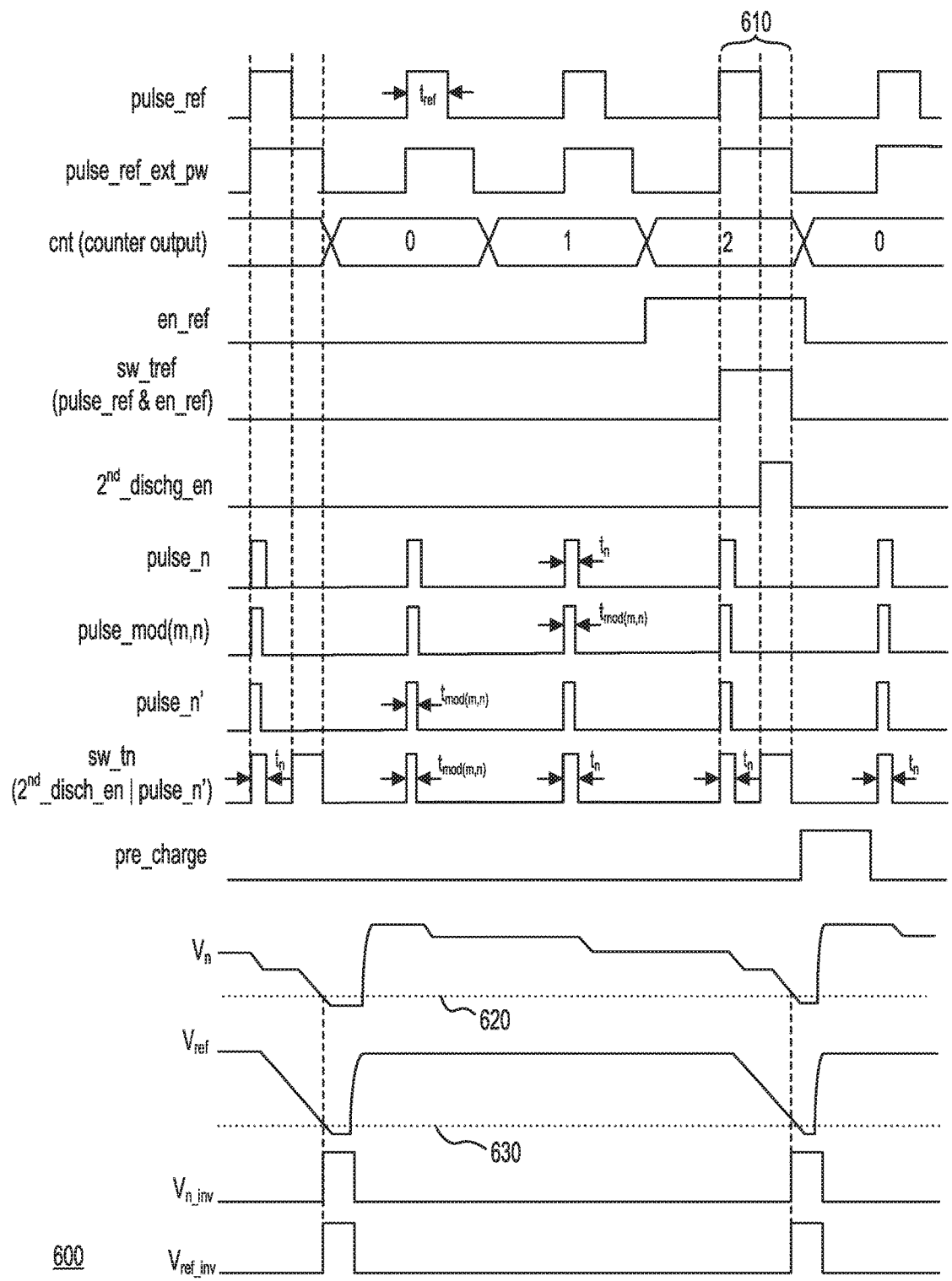
FIG. 6 is a timing diagram showing the signals associated with the system of FIG. 2 in accordance with another example.

FIG. 6 is a timing diagram 600 showing the signals associated with system 200 of FIG. 2 in accordance with one example. As explained earlier with respect to FIG. 4, control logic 400 may be implemented to address two different cases: (1) a case where n (n is the number of phase being interpolated) is a factor of m (the total number of phases being interpolated) (i.e., mod (m,n) equals 0); and (2) a case where n is not a factor of m (i.e., mod (m,n) is not equal to 0). This example corresponds to a case in which mod (m, n) is not equal to 0. FIG. 6 corresponds to a case in which the number of the phase being interpolated (n) equals 3 and thus mod (m, n) is not equal to 0 (assuming m=8). Unless otherwise indicated, the signals shown in timing diagram are the same or similar to the signals described earlier with respect to FIG. 2 and FIG. 4. The pulse_n signal may correspond to the pulse_n' signal received via the input terminal (IN1) of control logic 400 of FIG. 4 and the pulse_ref signal may correspond to the pulse_ref signal received via the input terminal (IN2) of control logic 400 of FIG. 4. The pulse_ref_ext_pw signal, the cnt (counter output) signal, the en_ref, and the $2^{nd}$_dischg_en signal may correspond to the internal signals associated with control logic 400 of FIG. 4. The sw_tn signal may correspond to the output signal provided via the output terminal (OUT1) of control logic 400. The sw_tref signal may correspond to the output signal provided via the output terminal (OUT2) of control logic 400. In addition, as explained earlier the sw_tn signal and the sw_tref signal may be used to control discharging of capacitive arrays described in FIG. 2. Timespan 610 including the vertical dotted lines in FIG. 6 relate to the last discharging of capacitive array 265 of FIG. 2 and the only once discharging of capacitive array 269. As indicated by the pre_charge signal in FIG. 6, after this discharging phase, the capacitive arrays are charged again pursuant to the assertion of the pre_charge signal as shown in FIG. 2.

Dotted line 620 in FIG. 6 corresponds to the threshold voltage of inverter 272 of FIG. 2 and dotted line 630 in FIG. 6 corresponds to the threshold voltage of inverter 274 of FIG. 2. In this example, if the two voltage levels (e.g., $V_n$ and $V_{ref}$) are exactly the same, then after the discharging of the capacitive arrays, the rising time of the pulse output from inverter 272 of FIG. 2 (shown as signal $V_{n\_inv}$ in FIG. 6) and the rising time of the pulse output from inverter 274 (shown as signal $V_{ref\_inv}$) will be substantially the same. On the other hand, if the two voltages are slightly different in terms of their magnitude, then the rising edges of the pulses will have a small time difference, which will be detected by comparator 280. Although FIG. 6 shows certain signals in timing diagram 600 having a certain relationship to each other, system 200 and control logic 400 may be designed differently, such that the signals shown in timing diagram 600 may have a different relationship to each other.

Figure 7:
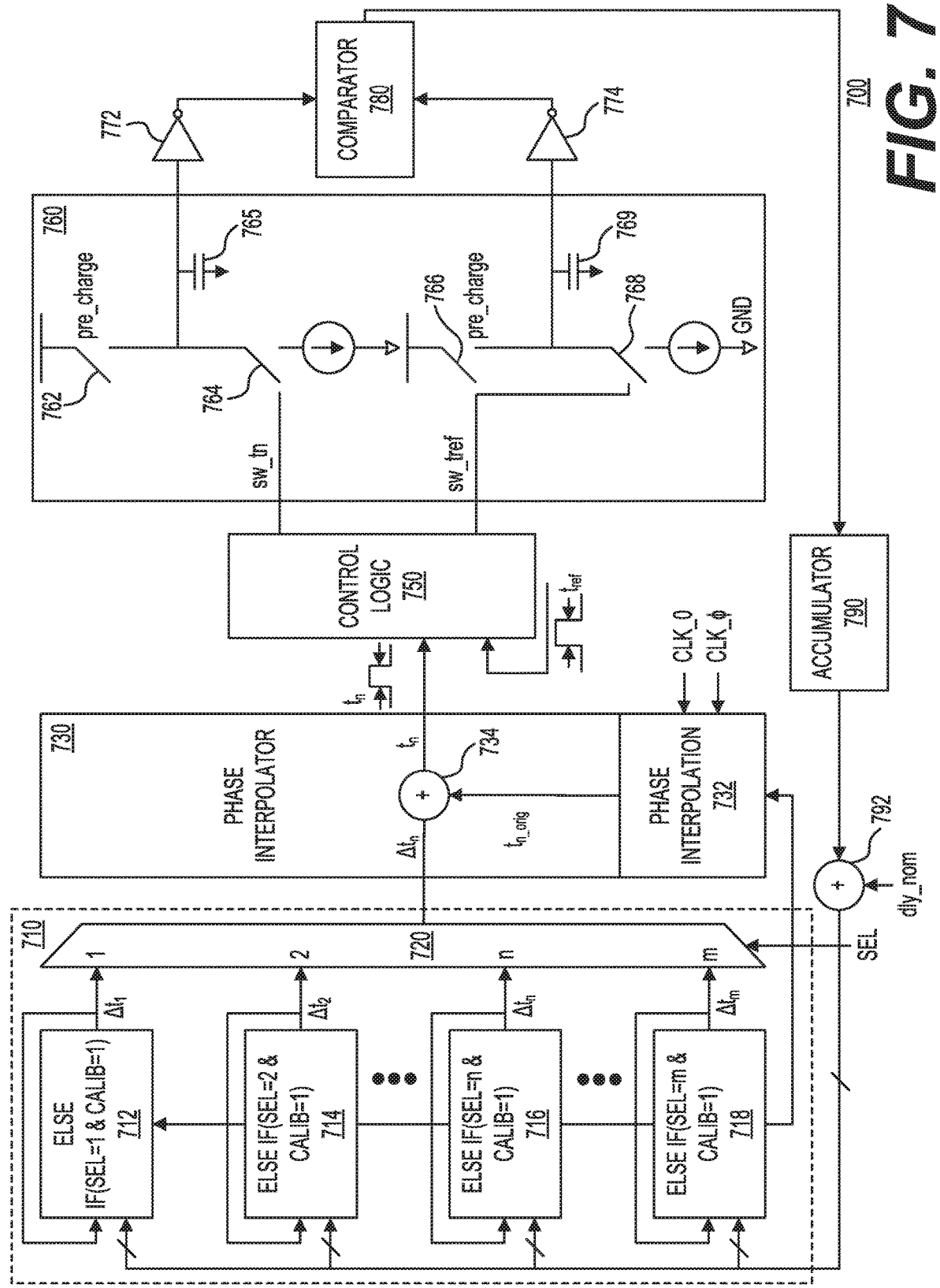
FIG. 7 is a block diagram of a system including a phase interpolator with clock phase calibration in accordance with another example.

FIG. 7 is a block diagram of a system 700 including a phase interpolator with clock phase calibration in accordance with another example. System 700 may correspond to an implementation that uses the difference in the size of the load capacitors that are charged/discharged. System 700 may include a calibration stage 710, a phase interpolator 730, a control logic 750, a capacitive load stage 760, a comparator 780, and an accumulator 790. Like system 200 of FIG. 2, system 700 may operate in a calibration mode or a normal mode. In the calibration mode, system 700 may be operated to allow for time amplifier-based phase calibration. Calibration stage 710 may include circuitry to provide a controlled amount of delay in time based on feedback provided to calibration stage 710, In this example, calibration stage 710 may include logic blocks (e.g., logic blocks 712, 714, 716, and 718) that may respond to two control signals: a select (SEL) signal and a calibration (CALIB) signal. When system 700 is set to operate in the calibration mode, the CALIB signal may be set to a logic high value (e.g., logic 1). Alternatively, when system 700 is set to operate in the normal mode, the CALIB signal may be set to a logic low value (e.g., logic 0). The value of the SEL signal may determine which delay amount ($\Delta t_1$, $\Delta t_2$, $\Delta t_n$, or $\Delta t_m$) is applicable. In this example, if the value of the SEL signal is 1 then the delay amount of $\Delta t_1$ may be applicable, if the value of the SEL signal is 2 then the delay amount of $\Delta t_2$ may be applicable, if the value of the SEL signal is n then the delay amount of $\Delta t_n$ may be applicable, or if the value of the SEL signal is m then the delay amount of $\Delta t_m$ may be applicable. Calibration stage 710 may further include a multiplexer 720 coupled to logic blocks 712, 714, 716, and 718. The output delay amounts may be supplied to multiplexer 220 that may be controlled using the SEL signal, as well. Thus, based on the value of the SEL signal, multiplexer 720 may output the appropriate delay (e.g., in the form of a digital code reflective of the delay) to phase interpolator 730. The SEL signal may equal to a value n', wherein n'=n or mod (m, n) depending on whether mod (m, n) is equal to zero or not.

In one example, calibration stage 710 may be used to calibrate for each of the phases for the interpolator. Thus, if the phase interpolator has an M number of interpolated phases (M being a positive integer) within a reference time interval then calibration stage 710 may be used to generate digital codes (or analog values) corresponding to each of the M phases. The digital code values may be latched in respective latches, a lookup table, or in one or more registers.

With continued reference to FIG. 7, phase interpolator 730 may be implemented in a similar manner as described with respect to FIG. 1. The time interval corresponding to the pre-calibration interpolated phase signal ($t_{n\_orig}$) may be adjusted based on the delay output from calibration stage 710. As an example, FIG. 7 shows a summer 734, which may be used to adjust the pre-calibration interpolated phase signal ($t_{n\_orig}$). The output of phase interpolator 730 may be coupled to control logic 750. Control logic 750 may be configured to control a capacitive load stage 760. Control logic 750 may be configured to provide two control signals: sw_tn and sw_tref, Each of these signals may be used to control discharging of the capacitive arrays in capacitive load stage 760. Control logic 750 may be implemented in a similar manner as control logic 250 with changes to accommodate the differences in the operations of charging/discharging of the capacitive loads.

Still referring to FIG. 7, capacitive load stage 760 may be configured to receive the control signals from control logic 750 and provide output voltages that may be compared directly or indirectly (e.g., by using a comparator 780). In this example, capacitive load stage 760 may include two capacitor arrays (e.g., capacitor array 765 and capacitor array 769). Each of capacitor array 765 and capacitor array 769 may be implemented using transistors or other semiconductor devices as a collection of such devices to provide appropriate capacitance values. In this example, capacitor array 765 and capacitor array 769 provide a proportional load in terms of the capacitance values. In this example, the proportional load may have a ratio of n/m, where n is the number of phase being interpolated and m is the total number of phases being interpolated. Capacitive load stage 760 may further include switches 762, 764, 766 and 768 that may control the flow of current to (or from) a respective capacitor. Switch 762 may be used to pre-charge capacitor array 765 based on the status of the pre_charge signal. Switch 766 may be used to pre-charge capacitor array 769 based on the status of the other pre_charge signal shown in FIG. 7. Switch 764 (controlled by signal sw_tn) may be used to discharge capacitor array 765. Switch 768 (controlled by the gated signal sw_tref) may be used to discharge capacitor array 769.

Figure 8:
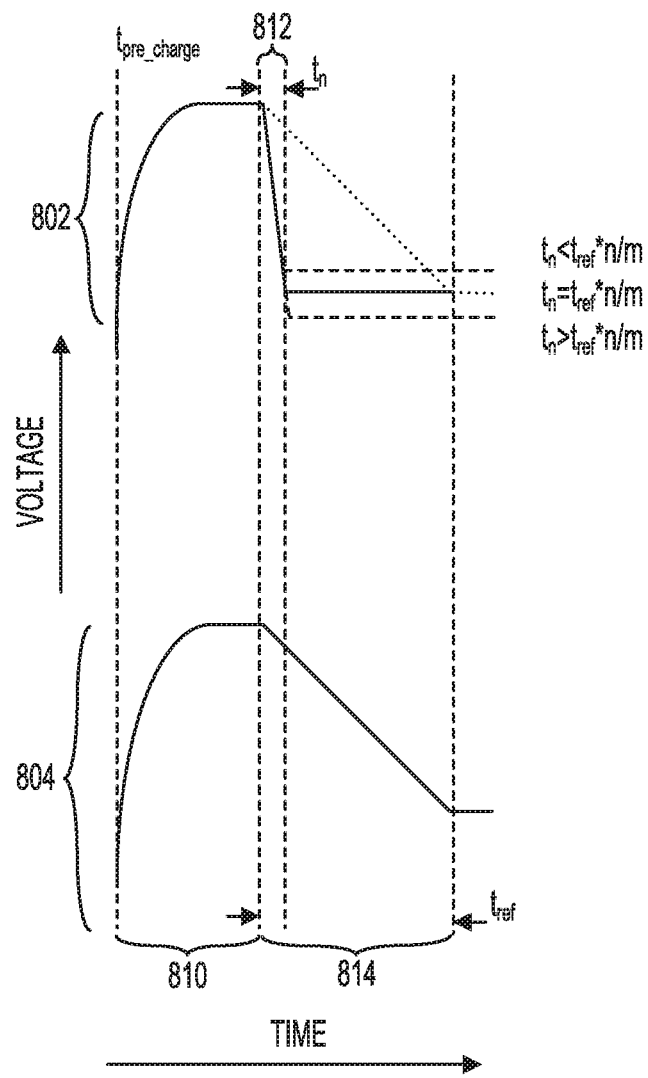
FIG. 8 shows voltage waveforms associated with the capacitive load stage of system of FIG. 7 in accordance with one example.

FIG. 8 shows voltage waveforms 800 associated with system of FIG. 7 in accordance with one example. Waveforms 800 reflect the shape and the magnitude of the voltages associated with capacitive array 765 and capacitive array 769 by mapping the magnitude of the voltage in a vertical direction and the time in a horizontal direction. Waveforms 802 correspond to the charging and the discharging of capacitor array 765 and waveform 804 corresponds to the charging and discharging of capacitor array 769. Timespan 810 corresponds to the magnitude of the voltages during pre-charging of the two capacitive arrays. Timespan 812 corresponds to the discharging of capacitive array 765 for a time interval of $t_n$. Timespan 814 corresponds to the discharging of capacitive array 765 for a time interval of $t_{ref}$. In this example, capacitor array 765 and capacitor array 769 provide a proportional load in terms of the respective capacitance values. The proportional load may have a ratio of n/m, where n is the number of phase being interpolated and m is the total number of phases being interpolated, and which is also the nominal value of $t_n/t_{ref}$.

Referring back to FIG. 7, comparator 780 may be used to produce a digital value indicative of a difference between the two output signals received from capacitive load stage 760. Comparator 780 may compare the two output signals (e.g., the voltage level $V_n$ corresponding to the output signal received from capacitor array 765 and the voltage level $V_{ref}$ corresponding to the output signal received from capacitive array 769) by converting the voltage difference into time difference. In this example, if the two voltage levels (e.g., $V_n$ and $V_{ref}$) are exactly the same, then after the discharging of the capacitive arrays, the rising time of the pulses output from inverters 772 and 774 will be substantially the same. On the other hand, if the two voltages are slightly different in terms of their magnitude, then the rising edges of the pulses will have a small time difference, which will be detected by comparator 780. Thus, instead of comparing voltage levels directly, the time difference between rising edges (or falling edges) may be compared. The use of the time comparator may help avoid the input DC dependence of the voltage comparator. Comparator 780 may generate a +1 if the output voltage from one of them is larger than the other one, a −1 if the output voltage from one of them is smaller than the other one, or a 0 if the output voltage from one of them is the same as the other one. In another example, comparator 780 may compare the voltage levels of the two output signals by using a voltage comparator. In this alternative example, system 700 may not include inverters 772 and 774. The output signals (e.g., the voltage level $V_n$ corresponding to the output signal received from capacitive array 765 and the voltage level $V_{ref}$ corresponding to the output signal received from capacitive array 769) may be compared to each other using a voltage comparator.

A feedback path including accumulator 790 may be used to provide feedback to calibration stage 710. Accumulator 790 may be used to integrate the output values provided by comparator 780 and scale the integrate value up or down using a constant. The output from accumulator 790 may be summed (e.g., using summer 792) with a nominal value for the delay (e.g., dly_nom in FIG. 7). Although FIG. 7 shows system 700 as including a certain number of components arranged and coupled in a certain way, system 700 may include fewer or additional components arranged and coupled differently. As an example, instead of a digital version of the accumulator, an analog version of the accumulator may also be used. The analog output value may be converted into a digital value using a digital to analog converter (DAC).

FIG. 9 shows a flow chart 900 of a method for calibrating a phase interpolator in accordance with one example. In one example, this method may be performed using various components of system 200 of FIG. 2 or system 700 of FIG. 7. Step 910 may include at least partially discharging a first pre-charged capacitive load at least in response to a signal output by the phase interpolator. As part of this step, as explained earlier with respect to FIG. 2, capacitive array 265 may be discharged based on the signal being output by the phase interpolator. The time interval associated with the signal being output by the phase interpolator may in turn result in the provision of the sw_tn control signal by control logic 250 (as described in detail further as control logic 400 in FIG. 4). The sw_tn control signal may cause discharging of capacitive array 265.

With continued reference to FIG. 9, step 920 may include at least partially discharging a second pre-charged capacitive load at least in response to a reference signal associated with the phase interpolator. As part of this step, as explained earlier with respect to FIG. 2, capacitive array 269 may be discharged based on the reference signal. The time interval associated with the reference signal may in turn result in the provision of the sw_tref control signal by control logic 250 (as described in detail further as control logic 400 in FIG. 4). The sw_tref control signal may cause discharging of capacitive array 269.

Still referring to FIG. 9, step 930 may include providing feedback to a calibration stage associated with the phase interpolator to modify a signal output by the phase interpolator, where the feedback is dependent on a first voltage provided by the first pre-charged capacitive load after at least partial discharging of the first pre-charged capacitive load and a second voltage provided by the second pre-charged capacitive load after at least partial discharging of the second pre-charged capacitive load. As explained earlier with respect to FIG. 2, comparator 280 may compare the voltage levels (e.g., the voltage level $V_n$ corresponding to the output signal received from capacitive array 265 and the voltage level $V_{ref}$ corresponding to the output signal received from capacitive array 269) of the two output signals and generate: a +1 if the output voltage from one of them is larger than the other one, a −1 if the output voltage from one of them is smaller than the other one, or a 0 if the output voltage from one of them is the same as the other one. In another example, comparator 280 may compare the voltage levels of the two output signals by first converting the voltage difference into time difference. In this example, if the two voltage levels (e.g., $V_n$ and $V_{ref}$) are exactly the same, then after the discharging of the capacitive arrays, the rising time of the pulses output from inverters 272 and 274 will be substantially the same. On the other hand, if the two voltages are slightly different in terms of their magnitude, then the rising edges of the pulses will have a small time difference, which will be detected by comparator 280. Further, as explained earlier with respect to FIG. 2, a feedback path including accumulator 290 may be used to provide feedback to calibration stage 210. Calibration stage 210 may output appropriate calibration codes such that the interpolator outputs a modified signal based on the calibration code. Although FIG. 9 shows a certain number of steps performed in a certain order, additional or fewer steps in a different order may be performed as part of flow chart 900.

Figure 10:
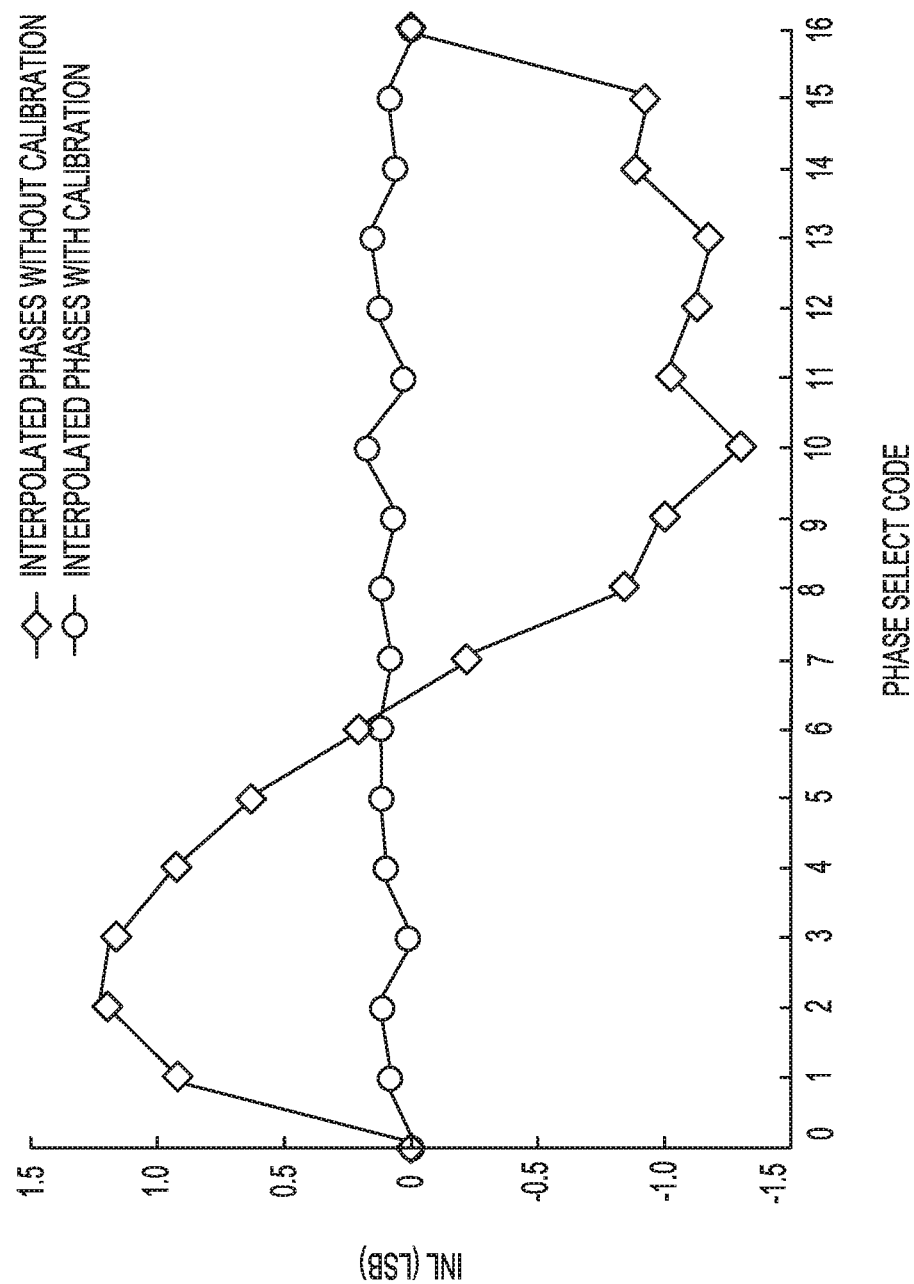
FIG. 10 shows a graph indicating improvements in the integrated nonlinearity associated with the phase interpolator in accordance with one example.

FIG. 10 shows a graph 1000 indicating improvements in the integrated nonlinearity associated with the phase interpolator in accordance with one example. Integrated nonlinearity of the phase interpolator relates to the deviation between an ideal output value and the actual measured output value for a certain phase select code. As shown in FIG. 10, the interpolated phases without calibration show large deviations in the integrated nonlinearity (INL) values, including at times deviations exceeding 1 least significant bit (LSB). On the other hand, the interpolated phases with calibration show smaller deviations in the integrated nonlinearity.

Figure 11:
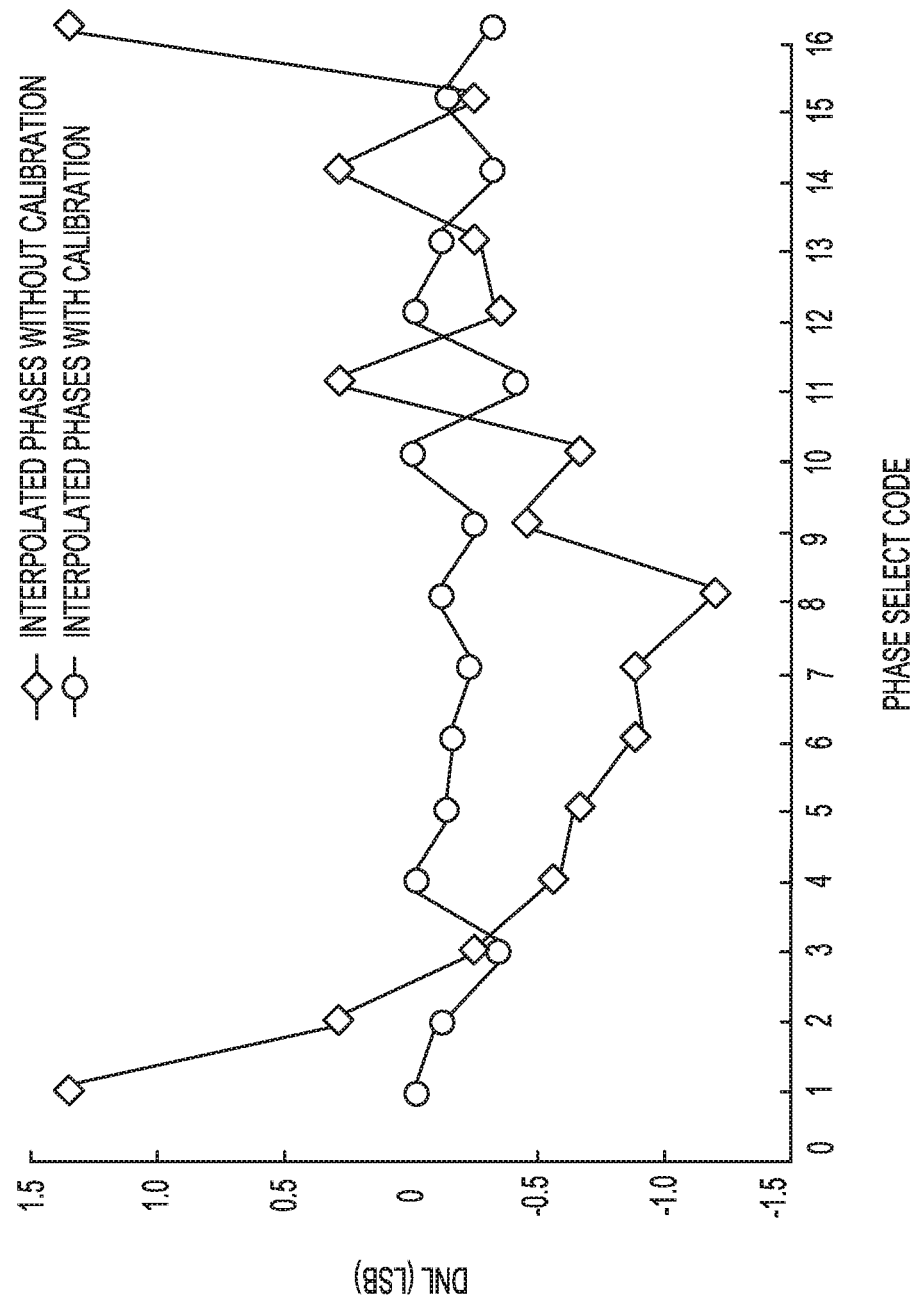
FIG. 11 shows a graph indicating improvements in the differential nonlinearity associated with the phase interpolator in accordance with one example.

FIG. 11 shows a graph 1100 indicating improvements in the differential nonlinearity associated with the phase interpolator in accordance with one example. Differential nonlinearity of the phase interpolator relates to the deviation between two analog values corresponding to adjacent digital codes for the phase interpolator. As shown in FIG. 11, the interpolated phases without calibration show large deviations in the differential nonlinearity (DNL) values, including at times deviations exceeding 1 least significant bit (LSB). On the other hand, the interpolated phases with calibration show smaller deviations in the differential nonlinearity.

In conclusion, the present disclosure relates to a system including a calibration stage configured to output a calibration code for a phase interpolator. The system may further include control logic configured to: (1) at least partially discharge a first pre-charged capacitive load at least in response to a signal output by the phase interpolator based on the calibration code, and (2) at least partially discharge a second pre-charged capacitive load at least in response to a reference signal associated with the phase interpolator. The system may further include a feedback path configured to provide feedback to the calibration stage to allow for a modification of the calibration code, where the feedback is dependent on a first voltage provided by the first pre-charged capacitive load after at least partial discharging of the first pre-charged capacitive load and a second voltage provided by the second capacitive load after at least partial discharging of the second pre-charged capacitive load.

The first pre-charged capacitive load may substantially be equal to the second capacitive load. During calibration of one of interpolated phases output by the phase interpolator; the second capacitive load may be discharged only once and the first pre-charged capacitive load may be discharged K number of times, where K is a positive integer greater than one.

In another example, the second capacitive load may be K number of times the first pre-charged capacitive load, where K is a positive number greater than one. During calibration of one of interpolated phases output by the phase interpolator each of the first pre-charged capacitive load and the second capacitive load may be discharged one or more number of times.

The system may further include a comparator, a first inverter coupled to receive the first voltage, and a second inverter coupled to receive the second voltage, where the feedback is determined by using the comparator comparing at least one rising edge of at least one pulse output by the first inverter with at least one rising edge of at least one pulse output by the second inverter. Alternatively, the system may include a voltage comparator, where the feedback is determined by comparing a magnitude of the first voltage and a magnitude of the second voltage using the voltage comparator.

The reference signal may be based on a reference clock source associated with the system. The first pre-charged capacitive load may comprise a first capacitive array, the second capacitive load may comprise a second capacitive array, and each of the first pre-charged capacitive load and the second capacitive load may be discharged at a constant current.

In another example, the present disclosure relates to a method for calibrating a phase interpolator. The method may include at least partially discharging a first pre-charged capacitive load at least in response to a signal output by the phase interpolator. The method may further include at least partially discharging a second pre-charged capacitive load at least in response to a reference signal associated with the phase interpolator. The method may further include providing feedback to a calibration stage associated with the phase interpolator to modify a signal output by the phase interpolator, where the feedback is dependent on a first voltage provided by the first pre-charged capacitive load after at least partial discharging of the first pre-charged capacitive load and a second voltage provided by the second pre-charged capacitive load after at least partial discharging of the second pre-charged capacitive load.

In the method, the first pre-charged capacitive load may substantially be equal to the second pre-charged capacitive load. The method may further include during calibration of one of interpolated phases output by the phase interpolator, at least partially discharging the second pre-charged capacitive load only once and at least partially discharging the first pre-charged capacitive load K number of times, where K is a positive integer greater than one.

In the method, the second pre-charged capacitive load may be K number of times the first pre-charged capacitive load, where K is a positive number greater than one. The method may include during calibration of one of interpolated phases output by the phase interpolator at least partially discharging each of the first pre-charged capacitive load and the second pre-charged capacitive load one or more number of times.

The method may further include: processing the first voltage using a first inverter; processing the second voltage using a second inverter; and determining the feedback by comparing at least one rising edge of at least one pulse output by the first inverter with at least one rising edge of at least one pulse output by the second inverter. Alternatively, the method may further include determining the feedback by comparing a magnitude of the first voltage with a magnitude of the second voltage.

The reference signal may be based on a reference clock source associated with the system. The first pre-charged capacitive load may comprise a first capacitive array, the second pre-charged capacitive load may comprise a second capacitive array, and each of the first pre-charged capacitive load and the second pre-charged capacitive load may be discharged at a constant current.

In yet another example, the present disclosure relates to a system including a calibration stage configured to output a digital calibration code for a phase interpolator. The system may further include control logic configured to: (1) at least partially discharge a first pre-charged capacitive array at least in response to a signal output by the phase interpolator based on the digital calibration code, and (2) at least partially discharge a second pre-charged capacitive load at least in response to a reference signal associated with the phase interpolator, where the first pre-charged capacitive load is substantially equal to the second pre-charged capacitive load, where during calibration of one of interpolated phases output by the phase interpolator, the second pre-charged capacitive load is discharged only once and the first pre-charged capacitive load is discharged K number of times, where K is a positive integer greater than one. The system may further include a feedback path configured to provide feedback to the calibration stage to allow for a modification of the digital calibration code, where the feedback is dependent on a first voltage provided by the first pre-charged capacitive load after at least partial discharging of the first pre-charged capacitive load and a second voltage provided by the second pre-charged capacitive load after at least partial discharging of the second pre-charged capacitive load.

The system may further include a comparator, a first inverter coupled to receive the first voltage, and a second inverter coupled to receive the second voltage, and where the feedback may be determined by using the comparator comparing at least one rising edge of at least one pulse output by the first inverter with at least one rising edge of at least one pulse output by the second inverter. Alternatively, the system may further include a voltage comparator, wherein the feedback is determined by comparing a magnitude of the first voltage and a magnitude of the second voltage using the voltage comparator.

The reference signal may be based on a reference clock source associated with the system. The reference signal may be derived from a voltage controlled oscillator. The first pre-charged capacitive load may comprise a first capacitive array, the second pre-charged capacitive load may comprise a second capacitive array, and each of the first pre-charged capacitive load and the second pre-charged capacitive load may be discharged at a constant current.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with some examples described in this disclosure can also include instructions stored in a non-transitory media. The term "non-transitory media" as used herein refers to any media storing data and/or instructions that cause a machine to operate in a specific manner. Exemplary non-transitory media include non-volatile media and/or volatile media. Non-volatile media include, for example, a hard disk, a solid-state drive, a magnetic disk or tape, an optical disk or tape, a flash memory, an EPROM, NVRAM, PRAM, or other such media, or networked versions of such media. Volatile media include, for example, dynamic memory such as DRAM, SRAM, a cache, or other such media. Non-transitory media is distinct from, but can be used in conjunction with, transmission media. Transmission media is used for transferring data and/or instruction to or from a machine, Exemplary transmission media include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A system comprising:
    a calibration stage configured to output a calibration code for a phase interpolator;
    control logic configured to: (1) at least partially discharge a first pre-charged capacitive load at least in response to a signal output by the phase interpolator based on the calibration code, and (2) at least partially discharge a second pre-charged capacitive load at least in response to a reference signal associated with the phase interpolator; and
    a feedback path configured to provide feedback to the calibration stage to allow for a modification of the calibration code, wherein the feedback is dependent on a first voltage provided by the first pre-charged capacitive load after at least partial discharging of the first pre-charged capacitive load and a second voltage provided by the second pre-charged capacitive load after at least partial discharging of the second pre-charged capacitive load.

2. The system of claim 1, wherein the first pre-charged capacitive load is substantially equal to the second pre-charged capacitive load, wherein during calibration of one of interpolated phases output by the phase interpolator, the second pre-charged capacitive load is discharged only once and the first pre-charged capacitive load is discharged K number of times, and wherein K is a positive integer greater than one.

3. The system of claim 1, wherein the second pre-charged capacitive load is K number of times the first pre-charged capacitive load, and wherein K is a positive number greater than one, and wherein during calibration of one of interpolated phases output by the phase interpolator each of the first pre-charged capacitive load and the second pre-charged capacitive load is discharged one or more number of times.

4. The system of claim 1 further comprising a comparator, a first inverter coupled to receive the first voltage, and a second inverter coupled to receive the second voltage, and wherein the feedback is determined by using the comparator comparing at least one rising edge of at least one pulse output by the first inverter with at least one rising edge of at least one pulse output by the second inverter.

5. The system of claim 1 further comprising a voltage comparator, wherein the feedback is determined by comparing a magnitude of the first voltage and a magnitude of the second voltage using the voltage comparator.

6. The system of claim 1, wherein the reference signal is based on a reference clock source associated with the system.

7. The system of claim 1, wherein the first pre-charged capacitive load comprises a first capacitive array, wherein the second pre-charged capacitive load comprises a second capacitive array, and wherein each of the first pre-charged capacitive load and the second pre-charged capacitive load is discharged at a constant current.

8. A method for calibrating a phase interpolator, the method comprising:

at least partially discharging a first pre-charged capacitive load at least in response to a signal output by the phase interpolator;

at least partially discharging a second pre-charged capacitive load at least in response to a reference signal associated with the phase interpolator; and providing feedback to a calibration stage associated with the phase interpolator to modify a signal output by the phase interpolator, wherein the feedback is dependent on a first voltage provided by the first pre-charged capacitive load after at least partial discharging of the first pre-charged capacitive load and a second voltage provided by the second pre-charged capacitive load after at least partial discharging of the second pre-charged capacitive load.

9. The method of claim 8, wherein the first pre-charged capacitive load is substantially equal to the second pre-charged capacitive load, wherein the method further comprises:

during calibration of one of interpolated phases output by the phase interpolator, at least partially discharging the second pre-charged capacitive load only once and at least partially discharging the first pre-charged capacitive load K number of times, and wherein K is a positive integer greater than one.

10. The method of claim 8, wherein the second pre-charged capacitive load is K number of times the first pre-charged capacitive load, wherein K is a positive number greater than one, and wherein the method further comprises:

during calibration of one of interpolated phases output by the phase interpolator at least partially discharging each of the first pre-charged capacitive load and the second pre-charged capacitive load one or more number of times.

11. The method of claim 10, further comprising:
processing the first voltage using a first inverter,
processing the second voltage using a second inverter; and
determining the feedback by comparing at least one rising edge of at least one pulse output by the first inverter with at least one rising edge of at least one pulse output by the second inverter.

12. The method of claim 8, further comprising determining the feedback by comparing a magnitude of the first voltage with a magnitude of the second voltage.

13. The method of claim 8, wherein the reference signal is based on a reference clock source associated with a system including the phase interpolator.

14. The method of claim 8, wherein the first pre-charged capacitive load comprises a first capacitive array, wherein the second pre-charged capacitive load comprises a second capacitive array, and wherein each of the first pre-charged capacitive load and the second pre-charged capacitive load is discharged at a constant current.

15. A system comprising:
a calibration stage configured to output a digital calibration code for a phase interpolator;
control logic configured to: (1) at least partially discharge a first pre-charged capacitive load at least in response to a signal output by the phase interpolator based on the digital calibration code, and (2) at least partially discharge a second pre-charged capacitive load at least in response to a reference signal associated with the phase interpolator, wherein the first pre-charged capacitive load is substantially equal to the second pre-charged capacitive load, wherein during calibration of one of interpolated phases output by the phase interpolator, the second pre-charged capacitive load is discharged only once and the first pre-charged capacitive load is discharged K number of times, and wherein K is a positive integer greater than one; and
a feedback path configured to provide feedback to the calibration stage to allow for a modification of the digital calibration code, wherein the feedback is dependent on a first voltage provided by the first pre-charged capacitive load after at least partial discharging of the first pre-charged capacitive load and a second voltage provided by the second pre-charged capacitive load after at least partial discharging of the second pre-charged capacitive load.

16. The system of claim 15 further comprising a comparator, a first inverter coupled to receive the first voltage, and a second inverter coupled to receive the second voltage, and wherein the feedback is determined by using the comparator comparing at least one rising edge of at least one pulse output by the first inverter with at least one rising edge of at least one pulse output by the second inverter.

17. The system of claim 15 further comprising a voltage comparator, wherein the feedback is determined by comparing a magnitude of the first voltage and a magnitude of the second voltage using the voltage comparator.

18. The system of claim 15, wherein the reference signal is based on a reference clock source associated with the system.

19. The system of claim 18, wherein the reference signal is derived from a voltage controlled oscillator.

20. The system of claim 15, wherein the first pre-charged capacitive load comprises a first capacitive array, wherein the second pre-charged capacitive load comprises a second capacitive array, and wherein each of the first pre-charged capacitive load and the second pre-charged capacitive load is discharged at a constant current.

* * * * *